United States Patent
Yoshida et al.

(10) Patent No.: US 8,003,476 B2
(45) Date of Patent: Aug. 23, 2011

(54) SEMICONDUCTOR DEVICE HAVING A PLURALITY OF KINDS OF WELLS AND MANUFACTURING METHOD THEREOF

(75) Inventors: Masaaki Yoshida, Hyogo (JP); Naohiro Ueda, Hyogo (JP); Masato Kijima, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 619 days.

(21) Appl. No.: 12/213,676

(22) Filed: Jun. 23, 2008

(65) Prior Publication Data

US 2008/0268626 A1 Oct. 30, 2008

Related U.S. Application Data

(62) Division of application No. 10/803,931, filed on Mar. 19, 2004, now Pat. No. 7,405,460.

(30) Foreign Application Priority Data

Mar. 20, 2003 (JP) ................................. 2003-079121
Jul. 15, 2003 (JP) ................................. 2003-196847
Nov. 10, 2003 (JP) ................................. 2003-379401

(51) Int. Cl.
*H01L 21/331* (2006.01)

(52) U.S. Cl. ................ 438/376; 257/502; 257/E27.067; 257/E21.644

(58) Field of Classification Search .................. 257/371, 257/500, 502, 566, E27.067, E21.644; 438/369, 438/370, 372, 373, 376
See application file for complete search history.

(56) References Cited

U.S. PATENT DOCUMENTS

| | | | |
|---|---|---|---|
| 4,697,332 A * | 10/1987 | Joy et al. | 438/420 |
| 4,907,058 A | 3/1990 | Sakai | |
| 4,965,215 A | 10/1990 | Zambrano et al. | |
| 5,041,847 A | 8/1991 | Matsumoto et al. | |
| 5,043,788 A | 8/1991 | Omoto et al. | |
| 5,159,427 A | 10/1992 | Ogura et al. | |
| 5,319,236 A | 6/1994 | Fujihira | |
| 5,698,457 A * | 12/1997 | Noguchi | 438/200 |
| 5,726,475 A | 3/1998 | Sawada et al. | |
| 6,043,534 A | 3/2000 | Sogo | |
| 6,107,672 A | 8/2000 | Hirase | |
| 6,207,008 B1 | 3/2001 | Kijima | |
| 6,514,375 B2 | 2/2003 | Kijima | |
| 6,531,356 B1 | 3/2003 | Hayashi | |
| 6,590,445 B2 | 7/2003 | Ueda | |
| 2004/0075147 A1 | 4/2004 | Ueda et al. | |
| 2004/0113197 A1 | 6/2004 | Yoshida et al. | |

FOREIGN PATENT DOCUMENTS

JP 61-502993 12/1986

(Continued)

OTHER PUBLICATIONS

US 5,041,841, 08/1991, Matsumoto et al. (withdrawn)

*Primary Examiner* — David Vu

(74) *Attorney, Agent, or Firm* — Dickstein Shapiro LLP

(57) ABSTRACT

A semiconductor device has a configuration in which more than three kinds of wells are formed with small level differences. One kind of well from among the more than three kinds of wells has a surface level higher than other kinds of wells from among the more than three kinds of wells. The one kind of well is formed adjacent to and self-aligned to at least one kind of well from among the other kinds of wells. The other kinds of wells are different in one of a conductivity type, an impurity concentration and a junction depth, and include at least two kinds of wells having the same surface level.

8 Claims, 11 Drawing Sheets

FOREIGN PATENT DOCUMENTS

| | | |
|---|---|---|
| JP | H02-138756 A | 5/1990 |
| JP | 5-102427 | 4/1993 |
| JP | H07-106429 A | 4/1995 |
| JP | 2795565 | 6/1998 |
| JP | H11-330268 A | 11/1999 |
| JP | 2002-343884 A | 11/2002 |
| JP | 2003-068873 A | 3/2003 |

* cited by examiner

SEMICONDUCTOR DEVICE HAVING A PLURALITY OF KINDS OF WELLS AND MANUFACTURING METHOD THEREOF

CROSS-REFERENCE TO RELATED APPLICATIONS

This application is a divisional of U.S. patent application Ser. No. 10/803,931, filed on Mar. 19, 2004 now U.S. Pat. No. 7,405,460, the subject matter of which is incorporated in its entirety by reference herein.

BACKGROUND OF THE INVENTION

1. Field of the Invention

The present invention generally relates to semiconductor devices and, more particularly, to a semiconductor device having more than three kinds of wells in the same substrate and a manufacturing method of such a semiconductor device.

2. Description of the Related Art

A formation process of a well in a semiconductor manufacture process does not only influence an electrical property of a transistor formed in a semiconductor device, but also plays a very important roll to give influences to even a chip area and a manufacturing cost. Although it has been general to form two kinds of wells, N-well and P-well, thus far, a third well different from the N-well and P-well has become used more and more in reflecting the demand for a high-performance device.

A purpose of forming such a third well is: 1) to enable a formation of a high-voltage-withstanding element by forming a well having a small concentration; and 2) to form a triple well structure by forming a well having a deep junction.

A low-concentration well having a conductivity of N-type is referred to as "lightly-N-well", and a low-concentration well having a conductivity of P-type is referred to as "lightly-P-well". The lightly-N-well and the lightly-P-well are indispensable for a high-voltage-withstanding element, which operates at a high-voltage range. It should be noted that, in the present specification, a well having N-type conductivity is simply referred to as "N-well" and a well having P-type conductivity is simply referred to as "P-well".

Moreover, the triple well structure permits mixing of a negative power-supply circuit and is capable of shielding noise, and is also capable of improving a reliability of a dynamic random access memory (DRAM), etc. Thus, the triple well structure is widely used in a digital/analog mixed LSI and a memory mixed LSI, which contributes to the recent popularization of mobile phones and mobile terminals.

The above-mentioned way of thinking can be applied also to a case where the number of kinds of wells is increased to four or five, and a description will be given of the case where three kinds of wells are provided in the same substrate. The three kinds of wells may be "N-well/P-well/Lightly-N-well", "N-well/P-well/Lightly-P-well", or "N-well/P-well/triple well".

There is suggested a method of forming the three kinds of wells as shown in FIG. 1 (refer to Japanese Laid-Open Patent Application No. 61-502993). FIG. 1 is an illustration for explaining the process of forming three kinds of wells, which are the N-well, the P-well and the lightly-N-well, in the same substrate.

As shown in FIG. 1-(A), first a nitride film 1 is deposited on a silicon substrate 10, and a resist pattern 2 is formed according to a photolithography process so as to define an area where a lightly-N-well is formed. Then, a part of the nitride film 1 corresponding to an opening of the resist pattern 2 is removed by etching using the resist patter 2 as a mask, and phosphorous ions 3 are implanted or doped into the substrate 10 using an ion implantation or doping technique.

Thereafter, as shown in FIG. 1-(B), the substrate 10 is heat-treated in an oxidizing atmosphere after removing the resist pattern 2. According to the heat treatment, an oxide film 4 grows in the area where the nitride film 1 is removed, and the phosphorous ions 3 implanted into the silicon substrate 10 is diffused, thereby forming the lightly-N-well (Lightly-NW) 5.

Then, as shown in FIG. 1-(C), a resist pattern 7 is formed according to a photolithography process without removing the nitride film 1 so as to define an area where an N-well is formed.

As shown in FIG. 1-(D), after removing a part of the nitride film 1 corresponding to an opening of the resist pattern 7, phosphorous ions 8 are implanted or doped into the substrate 10 using an ion implantation or doping technique.

Then, as shown in FIG. 1-(E), after removing the resist pattern, the substrate 10 is heat-treated within an oxidizing atmosphere so as to cause an oxide film 2 growing up in the area where the phosphorous ions 8 are implanted or doped. Accordingly, the implanted or doped phosphorous ions 8 are diffused, which forms the N-well (NW) 20. At this time, since the previously formed oxide film 4 is exposed, the oxide film 4 is influenced by the heat treatment for forming the oxide film 9 and turns into an oxide film 4c having a thickness larger than the original film thickness. This lowers the level of the surface of the lightly-N-well 5c. Although the film thickness of the oxide film 4c depends on a condition of the oxidation process, if the condition of the oxidation process to form the oxide film 4 is the same as the condition of the oxidation process to form the oxide film 9, the film thickness of the oxide film 4c is about twice the film thickness of the oxide film 9.

As shown in FIG. 1-(F), after removing the nitride film 1, boron ions 11 are implanted into the substrate 10 using an ion implantation technique. At this time, a selection is made in the ion implantation or doping condition so that the previously formed oxide films 4c and 9 serve as implantation masks. Consequently, areas other than oxide films 4c and 9 are defined as P-wells.

Then, as shown in FIG. 1-(G), the substrate 10 is heat-treated within a nitrogen atmosphere. According to the heat treatment, the boron ions 11 are diffused, which forms the P-wells (PWs) 12. Thereafter, the oxide films 4c and 9 are removed, and the three wells, the lightly-N-well 5c, the N-well 20 and the P-wells 12, are completed.

However, according to the above-mentioned process, the thickness of the oxide film 4c is larger than the thickness of the oxide film 9. Thus, after removing both finally a difference in the level is generated between the P-wells 12 and the lightly-N well 5c, as indicated in a dotted circle 13 in FIG. 13-(G). If the level difference (step) is large, wire-breaking may occurs in wiring of a polysilicon or a metal, which is formed over the step. Additionally, if the level difference exceeds a focal depth in the photolithography, it becomes very difficult to form a device.

In order to decrease such a level difference between the wells, there is suggested a method in which the series of processes, the photolithography process→the ion implantation process→the oxide-film formation process, is performed twice (refer to Japanese Patent Publication No. 2795565). In this method, the second ion implantation is applied to areas outside the area where the first ion implantation is performed, and a thickness of the oxide film formed by the second oxidation is made smaller than a thickness of the oxide film formed by the first oxidation. By doing so, the level difference can be gentle two steps, which prevents the wiring extending over the level difference from being wire-broken. However, this method has a problem in that a device manufacturing process takes a long time since the series of processes, the photolithography process→the ion implantation or doping process→the oxide-film formation process, must be performed twice.

SUMMARY OF THE INVENTION

It is a general object of the present invention to provide an improved and useful semiconductor device in which the above-mentioned problems are eliminated.

A more specific object of the present invention is to provide a semiconductor device having a configuration in which more than three kinds of wells are formed with small level differences and a manufacturing method of such a semiconductor device.

In order to achieve the above-mentioned objects, there is provided according to one aspect of the present invention a semiconductor device comprising: a substrate; and more than three kinds of wells formed in the substrate, wherein one kind of well from among the more than three kinds of wells has a surface level higher than other kinds of wells from among the more than three kinds of wells; the one kind of well is formed adjacent to and self-aligned to at least one kind of well from among the other kinds of wells; and the other kinds of wells are different in one of a conductivity type, an impurity concentration and a junction depth, and include at least two kinds of wells having the same surface level.

Accordingly, although the semiconductor device of the present invention has three or more kinds of wells, only one step (level difference) is formed on the surface of the substrate. Thus, comparing with a conventional semiconductor device having two steps (level differences) on the surface of the substrate, a maximum step (maximum level difference) can be reduced. The reduced step can prevent a wire extending over the step from being broken or cut, and can also prevent the wells from exceeding a focal depth of a photolithographic process.

It should be noted that, the present invention, the semiconductor substrate may be a silicon substrate itself or an epitaxial layer formed on a silicon substrate. Therefore, in the present invention, the expression of the semiconductor substrate covers not only a silicon substrate but also an epitaxial layer.

In the semiconductor device according to the present invention, the three kinds of wells may include more than two kinds of wells having different impurity concentrations to each other. Additionally, at least one kind of well from among the other kinds of wells has an impurity concentration that is decreased to a level necessary to form a high-voltage transistor. The other kinds of wells may include more than two kinds of wells having different junction depths to each other. Further, one of the other kinds of wells having a larger depth may include a triple well in which a well of an opposite conductivity type having a smaller junction depth is formed.

Additionally, in the semiconductor device according to the present invention, the one kind of wells and the other kind of wells may be of different conductivity types to each other. Further, in the semiconductor device according to the present invention, a MOS transistor may be formed by a drain diffusion layer and a source diffusion layer formed in the more than three kinds of wells and a gate electrode formed on areas corresponding to the drain diffusion layer and the source diffusion layer via a gate insulating film.

Additionally, in the semiconductor device according to the present invention, MOS transistors may be formed by drain diffusion layers and source diffusion layers formed in the more than three kinds of wells and gate electrodes formed on areas corresponding to the drain diffusion layers and the source diffusion layers via a gate insulating film, and wherein one of the MOS transistors formed on the triple well is one of a MOS transistor constituting a power supply circuit, a MOS transistor constituting a circuit sensitive to a substrate noise and a MOS transistor constituting a circuit generating a noise.

Additionally, there is provided according to another aspect of the present invention a manufacturing method of a semiconductor device having more than three kinds of wells in a single substrate, comprising the steps of: (A) forming a first silicon nitride film on the substrate; (B) forming a first resist pattern by a photolithography so as to define a first well area, removing a part of the first silicon nitride film corresponding to an opening of the first resist pattern by etching, introducing first impurity ions into the first well area of the substrate by ion implantation so as to form the first well area, and removing the first resist pattern; (C) applying a heat treatment to the substrate within an oxidizing atmosphere so as to form a first thermal oxide film on an area of a surface of the substrate that is not covered by the first silicon nitride film and simultaneously diffuse the first impurity ions introduced into the substrate to form the first well; (D) removing the first silicon nitride film, forming a second silicon nitride film on the substrate including the first thermal oxide film, forming a second resist pattern on the second silicon nitride film by a photolithography so as to form a second well area, removing a part of the second silicon nitride film corresponding to an opening of the second resist pattern by etching so as to define the second well area, introducing second impurity ions into the second well area of the substrate by ion implantation so as to form the second well, and removing the second resist pattern; (E) applying a heat treatment to the substrate within an oxidizing atmosphere the same as the oxidizing atmosphere in the step (C) so as to form a second thermal oxide film on an area of a surface of the substrate that is not covered by the second silicon nitride film and simultaneously diffuse the second impurity ions introduced into the substrate to form the second well; (F) removing the second silicon nitride film, and introducing third impurity ions into the substrate by using the first and second thermal oxide films as masks so as to form a third well area in a self-alignment manner; and (G) applying a heat treatment to the substrate in a non-oxidizing atmosphere so as to diffuse the third impurity ions to form the third well.

According to the above-mentioned manufacturing method of the present invention, three or more kinds of wells can be formed so that one step (level difference) is formed on the substrate. Moreover, since the ion implantation for the final well formation is made in a self-aligning manner by using the oxide film formed as a mask, a number of photolithography processes can be reduced.

In the above-mentioned manufacturing method, the processes of steps (D) and (E) may be repeated for a plurality of times while changing at least one of a kind of the second impurity ions, an amount of the second impurity ions to be introduced and an implantation condition of the second impurity ions.

Additionally, there is provided according to another aspect of the present invention a manufacturing method of a semiconductor device having more than three kinds of wells in a single substrate, comprising the steps of: (A) forming a silicon nitride film on the substrate; (B) forming a first resist pattern by a photolithography to define a first well area, removing a part of the silicon nitride film corresponding to an opening of the first resist pattern by etching, introducing first impurity ions into the first well area of the substrate by ion implantation so as to form the first well area, and removing the first resist pattern; (C) forming a second resist pattern by a photolithography so as to form a second well area, removing a part of the silicon nitride film corresponding to an opening of the second resist pattern by etching so as to define the second well area, introducing second impurity ions into the second well area of the substrate by ion implantation so as to form the second well, and removing the second resist pattern; (D) applying a heat treatment to the substrate within an oxidizing atmosphere so as to form a second thermal oxide film on an area of a surface of the substrate that is not covered by the second silicon nitride film and simultaneously diffuse the first and second impurity ions introduced into the substrate to form the first and second wells; (E) removing the silicon nitride film, and introducing third impurity ions into the substrate by using the thermal oxide film as a mask so as to form a third well area in a self-alignment manner; and (F) applying a heat treatment to the substrate in a non-oxidizing atmosphere so as to diffuse the third impurity ions to form the third well.

According to the above-mentioned manufacturing method of the present invention, three or more kinds of wells can be formed so that one step (level difference) is formed on the substrate. Moreover, since the ion implantation for the final well formation is made in a self-aligning manner by using the oxide film formed as a mask, a number of photolithography processes can be reduced.

In the above-mentioned manufacturing method, the step (B) may include a step of applying a heat treatment in a non-oxidizing atmosphere before proceeding to a subsequent ion implantation process. Accordingly, the depth (junction depth) of the diffusion layer formed prior to the heat treatment process can be increased by the heat treatment within the non-oxidizing atmosphere without changing the surface level (height) of the wells.

The step may (B) include a step of applying a heat treatment to the substrate in an oxidizing atmosphere so as to form a protective oxide film on the surface of the substrate before applying the heat treatment in the non-oxidizing atmosphere. Accordingly, a crystal defect in the semiconductor substrate due to the heat treatment within a non-oxidizing atmosphere can be prevented from being generated.

In the manufacturing method according to the present invention, the protective oxide film may have a thickness in a range of 10 nm to 50 nm. Accordingly, generation of the crystal defect in the semiconductor substrate can be prevented without forming on the surface of the semiconductor substrate a step (level difference) of a magnitude, which may cause a problem.

Additionally, in the manufacturing method according to the present invention, the process of step (B) may be repeated for a plurality of times while changing at least one of a kind of the first impurity ions, an amount of the first impurity ions to be introduced and an implantation condition of the first impurity ions. Thereby, four or more kinds of wells can be formed.

Additionally, the manufacturing method according to the present invention may further comprise a step of applying a heat treatment to the substrate in a non-oxidizing atmosphere after repeating the process of step (B) and before proceeding to a subsequent ion implantation process. Accordingly, four or more kinds of wells can be formed, and also the junction depth of the diffusion layer formed prior to the heat treatment within the non-oxidizing atmosphere can be increased without changing the surface level (height) of the wells.

The above-mentioned manufacturing method may further comprise a step of applying a heat treatment to the substrate in an oxidizing atmosphere so as to form a protective oxide film on the surface of the substrate before applying the heat treatment in the non-oxidizing atmosphere. Accordingly, generation of the crystal defect in the semiconductor substrate caused by the heat treatment within a non-oxidizing atmosphere can be prevented.

In the above-mentioned manufacturing method, the protective oxide film may have a thickness in a range of 10 nm to 50 nm. Accordingly, generation of the crystal defect in the semiconductor substrate can be prevented without forming on the surface of the semiconductor substrate a step (level difference) of a magnitude, which may cause a problem.

In the present invention, a deeper well may be formed earlier since the wells formed earlier have a larger depth due to an increased number of heat treatment processes.

The manufacturing method according to the present invention may further comprise a step of forming a third resist pattern within a specific well by a photolithography so as to define a triple well before applying the final heat treatment in the non-oxidizing atmosphere, introducing fourth impurity ions of a conductivity type opposite to the specific well into the substrate under a condition in which a depth of the triple well becomes shallower than the specific well, and removing the third resist pattern.

In the above-mentioned manufacturing method according to the present invention, the final heat treatment in the non-oxidizing atmosphere may be omitted so that the third impurity ions are diffused by a heat treatment applied when performing a field oxidation for element isolation.

The manufacturing method according to the present invention may further comprise a step of forming a third resist pattern within a specific well by a photolithography so as to define a triple well before applying the final heat treatment in the non-oxidizing atmosphere, introducing fourth impurity ions of a conductivity type opposite to the specific well into the substrate under a condition in which a depth of the triple well becomes shallower than the specific well, and removing the third resist pattern.

In the manufacturing method according to the present invention, the final heat treatment in the non-oxidizing atmosphere may be omitted so that the third impurity ions are diffused by a heat treatment applied when performing a field oxidation for element isolation.

Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of several embodiments of the present invention.

First Embodiment

Figure 1:
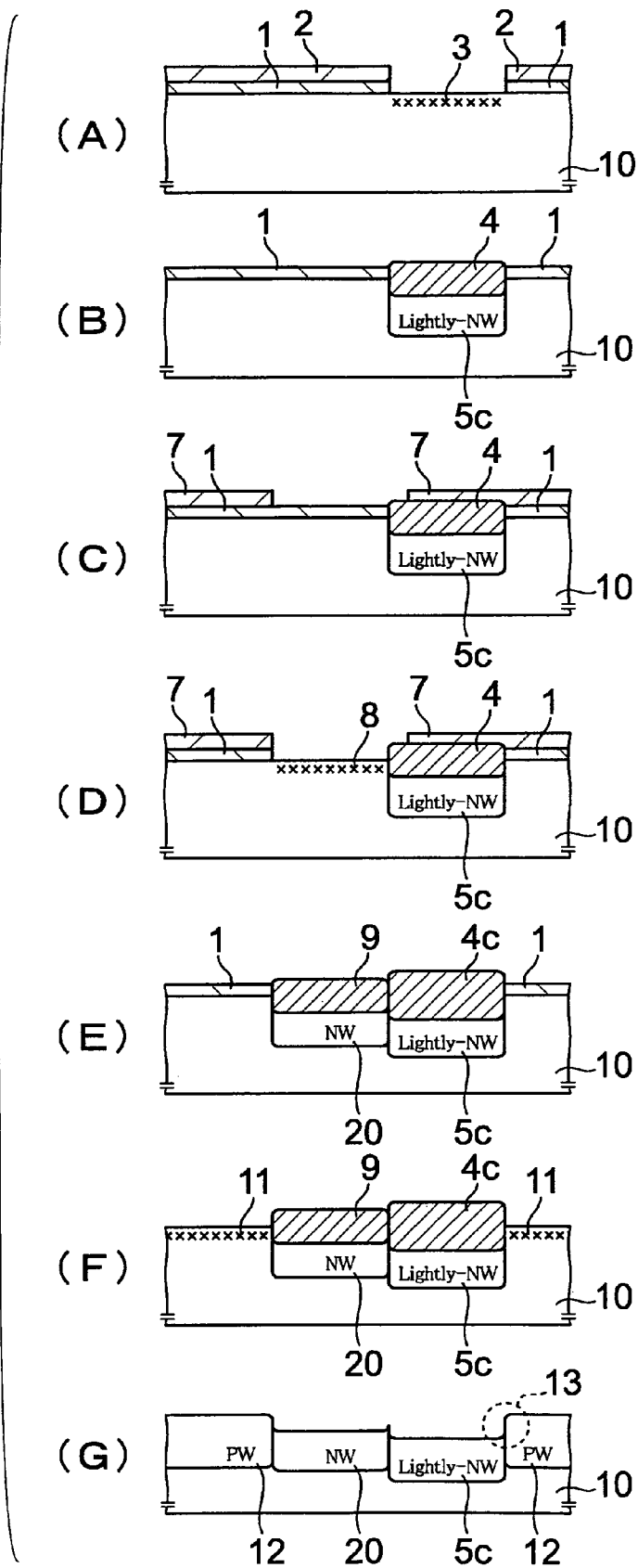
FIG. 1 is an illustration for explaining a process of forming three kinds of wells in the same substrate.
Figure 2:
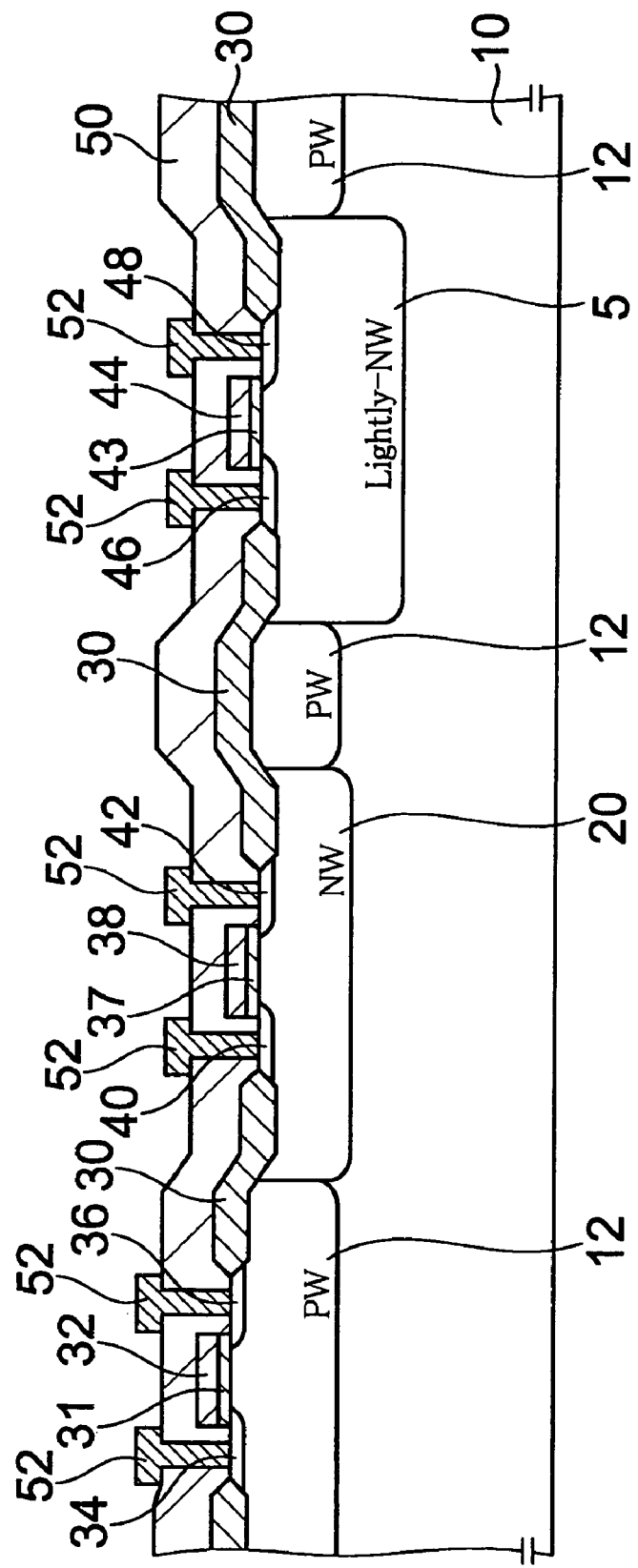
FIG. 2 is a cross-sectional view of a part of a semiconductor device according to a first embodiment of the present invention.

FIG. 2 is a cross-sectional view of a part of a semiconductor device according to a first embodiment of the present invention. As shown in FIG. 1, three kinds of wells 5, 12 and 20 are formed on a surface of a P-type silicone substrate 10. The well 20 is an N-well (NW), which is formed by introducing or doping N-type impurities. The well 5 is a lightly-N-well (Lightly-NW), of which impurity concentration is lower than that of the N-well 20. The N-well and the lightly-N-well are separated from each other. Each of the wells 12 is a P-well (PW), which is formed by introducing or doping P-type impurities at a concentration higher than the impurity concentration of the substrate 10. The P-wells 12 are formed in a self-aligning manner in the vicinity of the wells 5 and 20.

A surface level (height) of the P-wells 12 is higher than the surface level of the wells 5 and 20, and the surface levels (heights) of the well 5 and the well 20 are equal to each other. The surface levels of the three kinds of wells 5, 20 and 12 are two levels, and a level difference (step) between those wells is controlled to be small. The P-well 12 formed between the lightly-N-well 5 and the N-well 20 plays a roll of separating the wells.

A field oxide film 30 for separating elements is formed in a boundary area between the wells. A MOS transistor is formed in the well of an element area separated by the field oxide film 30. The P-well 12 on the left side in FIG. 1 is provided with a source 34 and a drain 36 that are formed by N-type diffusion layers, and a gate electrode 32 of a polysilicon is formed on an area between the diffusion layers 34 and 36 via a gate oxide film 31, which together constitute an N-channel MOS transistor.

The N-well 20 is provided with a source 40 and a drain 42 that are formed by P-type diffusion layers, and a gate electrode 38 of a polysilicon is formed on an area between the diffusion layers 40 and 42 via a gate oxide film 37, which together constitute a P-channel MOS transistor. The lightly-N-well 5 is provided with a source 46 and a drain 48 that are formed by P-type diffusion layers in the element area thereof, and a gate electrode 44 of a polysilicon is formed on an area between the diffusion layers 46 and 48 via a gate oxide film 43, which together constitute a P-channel MOS transistor. An inter-layer insulation film 50 is formed so as cover the above-mentioned MOS transistors, and metal wires 52 are connected to the corresponding diffusion layers via contact holes.

Figure 3:
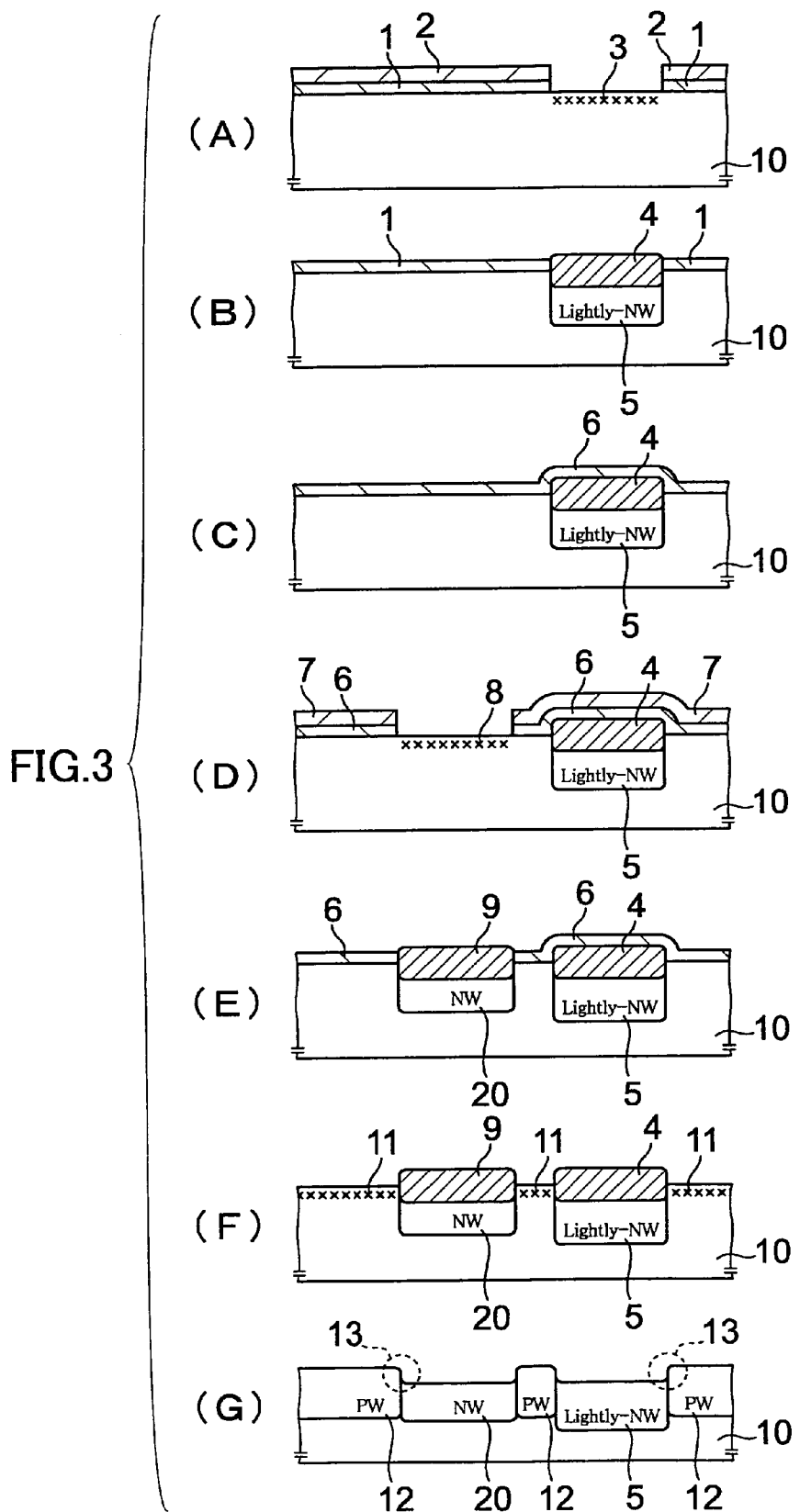
FIG. 3 is an illustration for explaining a manufacturing process of the semiconductor device shown in FIG. 2.

A description will now be given, with reference to FIG. 3, of a first method of manufacturing the semiconductor device shown in FIG. 2. FIG. 3 is an illustration for explaining a manufacturing process of the semiconductor device shown in FIG. 2.

As shown in FIG. 3-(A), a nitride film (silicon nitride film) 1 is deposited on the silicon substrate 10 with a film thickness of about 100 nm (nanometers). Although illustration is omitted, when forming a nitride film on a semiconductor substrate, the nitride film is formed via an oxide film. This also applies to other the embodiments described below. A resist pattern 2 is formed on the nitride film 1 using a photolithography process so as to define a lightly-N-well area. After removing by etching a portion of the nitride film 1 corresponding to an opening of the resist, phosphorous ions 3 are implanted into the substrate 10 using an ion implantation or doping technique with an acceleration energy of 160 KeV and an amount of implantation of $5\times10^{12}$ cm$^{-2}$.

Then, as shown in FIG. 3-(B), after removing the resist pattern 2, the substrate 10 is heat treated within an oxidizing atmosphere at 920° C. for 120 minutes. The oxidizing atmosphere is an atmosphere containing oxygen, and can be, for example, an atmospheric or oxygen atmosphere. According to the heat treatment, an oxide film 4 grows up to be a film thickness of about 300 nm in the area where the opening of the nitride film 1 is formed, and the phosphorous ions 3 are driven into the substrate 10, which forms the lightly-N-well 5.

As shown in FIG. 3-(C), after removing the nitride film 1, a nitride film (second silicone nitride film) 6 is deposited with a film thickness of on about 100 nm.

Then, as shown in FIG. 3-(D), a resist pattern 7 is formed by a photolithography process so as to define an N-well area. After removing a portion of the nitride film 6 corresponding to the opening of the resist using the resist pattern 7 as a mask, phosphorous ions 8 are implanted into the substrate 10 with an acceleration energy of 160 KeV and an amount of impregnation of $1\times10^{13}$ cm$^{-2}$.

As shown in FIG. 3-(E), after removing the resist pattern 7, the substrate 10 is heat-treated within an oxidizing atmosphere at 920° C. for 120 minutes. According to the heat treatment, an oxide film 9 grows up to be a film thickness of about 300 nm in the area where the opening of the nitride film 6 is formed, and the phosphorous ions 3 are driven into the substrate 10, which forms the N-well 20. At this time, since the oxide film 4 formed previously is covered by the nitride film 6, the oxidization does not progress further. That is, the initially formed film thickness of about 300 nm is maintained without change.

As shown in FIG. 3-(F), after removing the nitride film 6, boron ions 11 are implanted into the substrate 10 using an ion implantation or doping technique in a self-aligning manner. At this time, an ion-implantation condition is selected so that the previously formed oxide films 4 and 9 serve as implantation masks. As for such a condition, it is suitable to select an acceleration energy of 30 KeV and an amount of impregnation of $1\times10^{13}$ cm$^{-2}$. Consequently, areas other than the oxide film 4 and 9 are defined as P-wells.

As shown in FIG. 3-(G), the substrate 10 is heat-treated within a non-oxidizing atmosphere, for example, a nitrogen atmosphere, at 1150° C. for 60 minutes. Thereby, boron ions 11 are diffused and the P-wells 12 are formed. Removing the oxide films 4 and 9 on the surface of the substrate 10, completes the three kinds of wells, the lightly-N-well 5, N-well 20 and P-wells 12.

It should be noted that, instead of the heat treatment at 1150° C., a field oxidation may be applied to perform commonly the diffusion of the boron ions and the separation of the elements. The surface levels of the lightly-N-well 5 and the N-well 20 are reduced due to the formation of the oxide films 4 and 9.

It is an advantage of the above-mentioned method that the film thickness of the oxide film 4 does not change from the thickness immediately after the formation of the oxide film 4. That is, since the oxide film 4 formed in the process of FIG. 3-(B) is covered by the nitride film 6 in the subsequent process of FIG. 3-(C), the oxide film 4 is not influenced by the process of FIG. 3-(E) to form the oxide film 9. Consequently, the film thickness of the oxide film 4 and the film thickness of the oxide film 9 can be made equal to each other by appropriately equalizing the conditions of oxidation between the processes of FIG. 3-(B) and FIG. 3-(E). This means that the surface level (height) of the lightly-N-well 5 and the surface level (height) of the N-well 20 can be equalized in a state shown in FIG. 3-(G) which indicates the configuration after the removal of the oxide films 4 and 9. If the surface levels (height) of the wells 5 and 20 are equal to each other, "the level difference between the lightly-N-well 5 and the P-well 12" and "the level difference between the N-well 20 and the P-well 12" (both are indicated by dotted circles 13) can be the same configuration, which is convenient for progressing the manufacturing process. Furthermore, since both the original film thickness of the oxide films 4 and 9 are about 300 nm, there is no problem in the absolute values of the level differences (steps).

Thereafter, the semiconductor device shown in FIG. 2 is completed by forming a field oxide film 30 for element isolation in accordance with a usual process, forming gate electrodes 32, 38 and 44 via gate oxide films 31, 37 and 43, forming diffusion layers 34, 36, 40, 42, 46 and 48 for providing sources and drains, forming an inter-layer insulating film 50, and forming metal wires 52 via contact holes.

Figure 4:
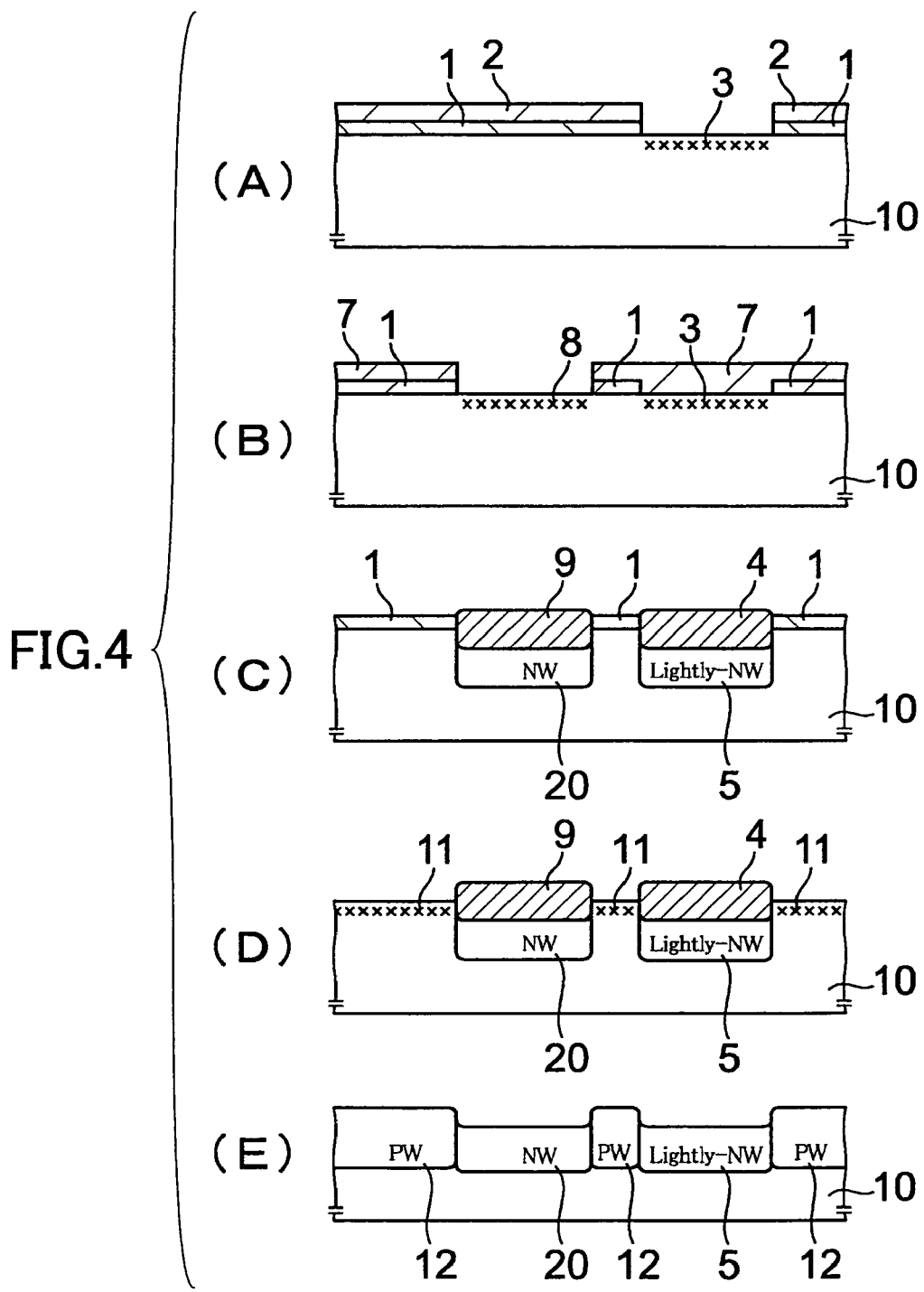
FIG. 4 is an illustration for explaining another manufacturing process of the semiconductor device shown in FIG. 2.

A description will now be given, with reference to FIG. 4, of a second method of manufacturing the semiconductor device shown in FIG. 2. FIG. 4 is an illustration for explaining another manufacturing process of the semiconductor device shown in FIG. 2.

As shown in FIG. 4-(A), a nitride film 1 is deposited on the silicon substrate 10 with a film thickness of about 100 nm, and a resist pattern 2 is formed on the nitride film 1 using a photolithography process so as to define a lightly-N-well area. After removing by etching a portion of the nitride film 1 corresponding to an opening of the resist, phosphorous ions 3 are implanted into the substrate 10 using an ion implantation or doping technique with an acceleration energy of 160 KeV and an amount of implantation of $5 \times 10^{12}$ cm$^{-2}$.

Then, as shown in FIG. 4-(B), after removing the resist pattern 2, a resist pattern 7 is formed using a photolithography process so as to define an N-well area. After removing by etching a portion of the nitride film 1 corresponding to an opening of the resist, phosphorous ions 3 are implanted into the substrate 10 using an ion implantation or doping technique with an acceleration energy of 160 KeV and an amount of implantation of $1 \times 10^{13}$ cm$^{-2}$.

Then, as shown in FIG. 4-(C), after removing the resist pattern 7, the substrate 10 is heat-treated within an oxidizing atmosphere at 920° C. for 120 minutes. Thus, the oxide films 4 and 9 grow up in the areas corresponding to the openings of the nitride film 1. At this time, since the areas corresponding to the openings of the nitride film 1 are the "lightly-N-well area" and the "N-well area", the both areas are oxidized simultaneously, which results in simultaneous formation of the oxide film 4 and the oxide film 9 on the respective well areas. Additionally, the phosphorous ions 3 and the phosphorous ions 8 that have been implanted are driven into the substrate 10, which forms the lightly-N-well 5 and the N-well 20.

As shown in FIG. 4-(D), after removing the nitride film 1, boron ions 11 are implanted into the substrate 10 using an ion implantation or doping technique in a self-aligning manner. At this time, an ion-implantation condition is selected so that the previously formed oxide films 4 and 9 serve as implantation masks. As for such a condition, it is suitable to select an acceleration energy of 30 KeV and an amount of impregnation of $1 \times 10^{13}$ cm$^{-2}$. Consequently, areas other than the oxide films 4 and 9 are defined as P-wells.

Then, as shown in FIG. 4-(E), the substrate 10 is heat-treated within a non-oxidizing atmosphere, for example, a nitrogen atmosphere, at 1150° C. for 60 minutes. Thereby, boron ions 11 are diffused and the P-wells 12 are formed. Removal of the oxide films 4 and 9 on the surface of the substrate 10 completes the three kinds of wells, the lightly-N-well 5, N-well 20 and P-wells 12.

It should be noted that, instead of the final heat treatment at 1150° C., a field oxidation may be applied to perform commonly the diffusion of the boron ions 11 and the separation of the elements.

Thereafter, the semiconductor device shown in FIG. 2 is completed by forming the field oxide film 30 for element isolation in accordance with a usual process, forming the gate electrodes 32, 38 and 44 via the gate oxide films 31, 37 and 43, forming the diffusion layers 34, 36, 40, 42, 46 and 48 for providing sources and drains, forming the inter-layer insulating film 50, and forming the metal wires 52 via contact holes.

It is an advantage of the above-mentioned method that the film thickness of the oxide films 4 and 9 are equal to each other since the oxide film 4 in the area of the lightly-N-well 5 and the oxide film 9 in the area of the N-well 20 are formed simultaneously in the same process. As a result, the surface level (height) of the lightly-N-well 5 and the surface level (height) of the N-well 20 become equal to each other in the state shown in FIG. 4-(E), which is a configuration after the removal of the oxide films 4 and 9. Since the surface levels (height) of the wells 5 and 20 are equal to each other, the "step between the lightly-N-well 5 and the P-well 12" and the "step between the N-well 20 and the P-well 12" (both are indicated by dotted circles 13) can be the same configuration, which is convenient for progressing the manufacturing process. Furthermore, since both the original film thickness of the oxide films 4 and 9 are about 300 nm, there is no problem in the absolute values of the level differences (steps).

Second Embodiment

Figure 5:
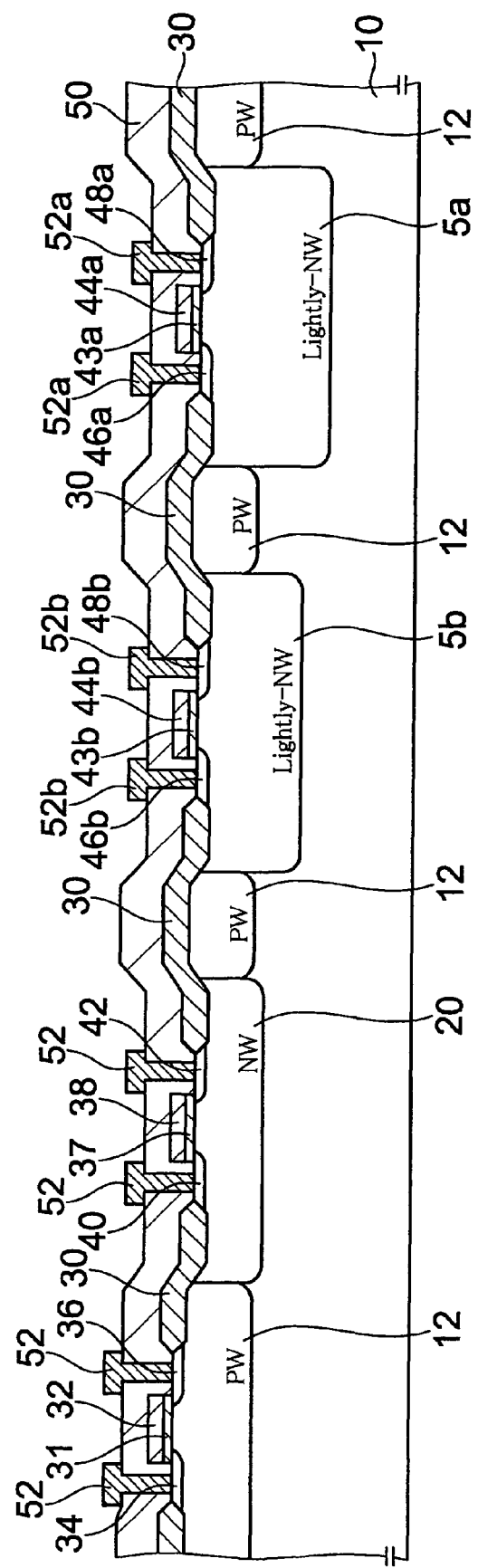
FIG. 5 is a cross-sectional view of a part of a semiconductor device according to a second embodiment of the present invention.

A description will now be given, with reference to FIG. 5, of a second embodiment of the present invention. FIG. 5 is a cross-sectional view of a part of a semiconductor device according to the second embodiment of the present invention.

The semiconductor device according to the second embodiment of the present invention differs from the semiconductor device shown in FIG. 2 in that the semiconductor device according to the second embodiment has two kinds of lightly-N-wells 5a and 5b. The lightly-N-well 5a has a diffusion depth, that is, a junction depth, larger than that of the lightly-N well 5b. The P-wells 12 are formed in a self-aligning manner in areas between the N-well 20 and the lightly-N-well 5b and between the lightly-N-well 5a and the lightly-N-well 5b so that the P-wells serve as element separators between wells.

In the present embodiment, also a MOS transistor is formed in each element area separated by the field oxide film 30. A source 46a and a drain 48a are formed by P-type diffusion layer in the lightly-N-well 5a, and a gate electrode 44a of a polysilicon is formed on the area between the diffusion layers 46a and 48a via a gate oxide film 43a, which together form a P-channel MOS transistor. A source 46b and a drain 48b are formed by P-type diffusion layer in the lightly-N-well 5b, and a gate electrode 44b of a polysilicon is formed on the area between the diffusion layers 46b and 48b via a gate oxide film 43b, which together form a P-channel MOS transistor. An inter-layer insulation film 50 is formed so as to cover these MOS transistors, and metal wires 52 are connected to each diffusion layer through contact holes.

A description will now be given, with reference to FIG. 6, of a method of forming wells provided in the semiconductor device according to the second embodiment shown in FIG. 5.

Figure 6:
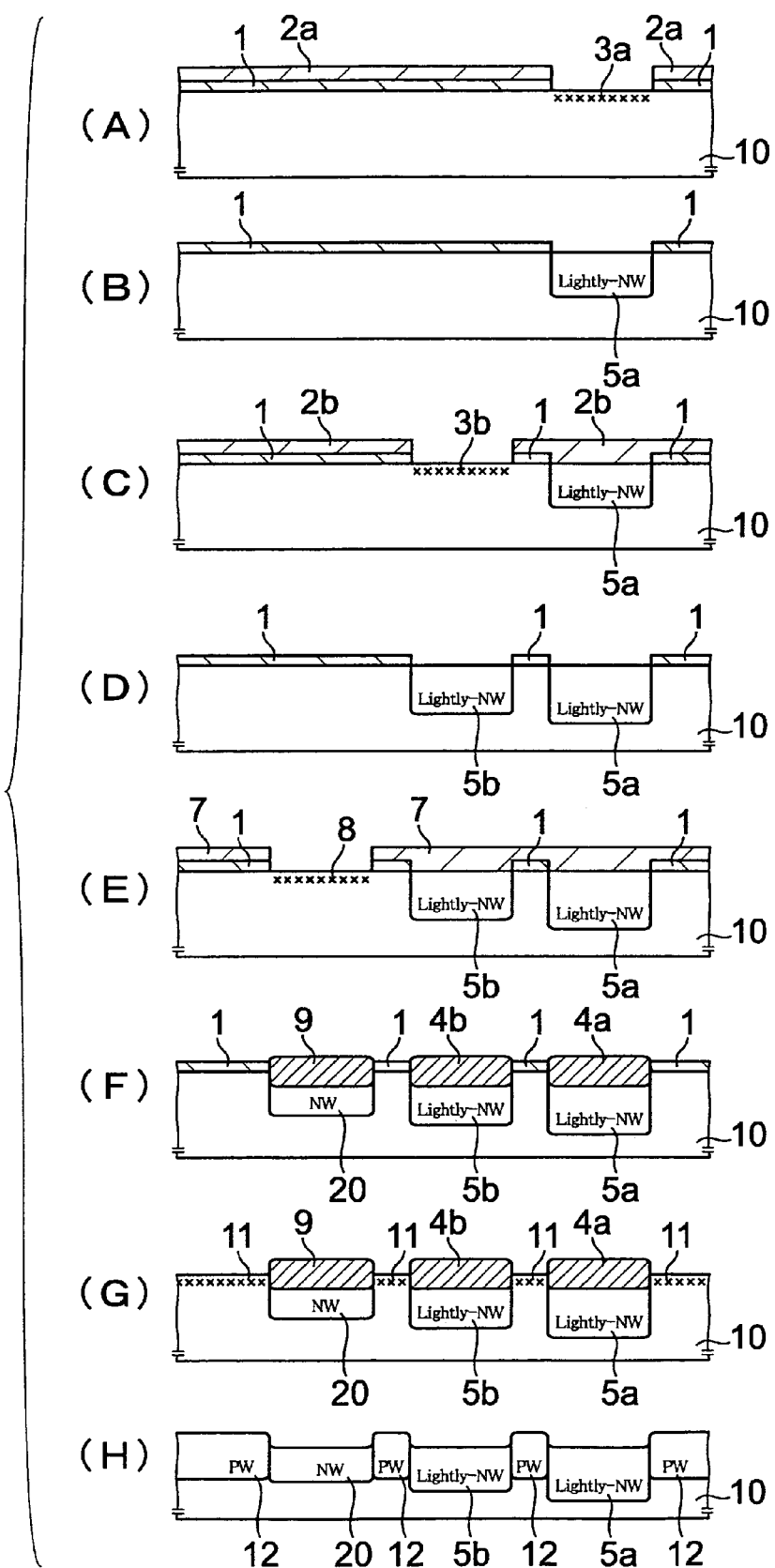
FIG. 6 is an illustration for explaining a manufacturing process of the semiconductor device shown in FIG. 5.

As shown in FIG. 6-(A), a nitride film 1 is deposited on the silicon substrate 10 with a film thickness of about 100 nm, and a resist pattern 2a is formed on the nitride film 1 using a photolithography process so as to define a first lightly-N-well area. After removing by etching a portion of the nitride film 1 corresponding to an opening of the resist, phosphorous ions 3a are implanted into the substrate 10 using an ion implantation or doping technique with an acceleration energy of 160 KeV and an amount of implantation of $5 \times 10^{12}$ cm$^{-2}$.

Then, as shown in FIG. 6-(B), after removing the resist pattern 2a, the substrate 10 is heat-treated within an oxidizing atmosphere at 1150° C. for 3 hours. Thus, the phosphorous ions 3a are driven into the substrate 10, which results in a formation of the lightly-N-well 5a.

As shown in FIG. 6-(C), a resist pattern 2b is formed using a photolithography process so as to define a second lightly-N-well area. After removing by etching a portion of the nitride film 1 corresponding to an opening of the resist, phosphorous ions 3b are implanted into the substrate 10 using an ion implantation or doping technique with an acceleration energy of 160 KeV and an amount of implantation of $8 \times 10^{12}$ cm$^{-2}$.

Then, as shown in FIG. 6-(D), after removing the resist pattern 2b, the substrate 10 is heat-treated within an oxidizing atmosphere at 1150° C. for 3 hours. Thus, the phosphorous ions 3b are driven into the substrate 10, which results in a formation of the lightly-N-well 5b. With this heat treatment, the phosphorous ions are further driven into the substrate 10 in the lightly-N-well area 5a, and, thereby, the lightly-N-well area 5a becomes deeper than that in the process of FIG. 6-(B).

Then, as shown in FIG. 6-(E), a resist pattern 7 is formed using a photolithography process so as to define an N-well area. After removing by etching a portion of the nitride film 1 corresponding to an opening of the resist, phosphorous ions 8 are implanted into the substrate 10 using an ion implantation or doping technique with an acceleration energy of 160 KeV and an amount of implantation of $1 \times 10^{13}$ cm$^{-2}$. Then, as shown in FIG. 6-(F), after removing the resist pattern 7, the substrate 10 is heat-treated within an oxidizing atmosphere at 920° C. for 120 minutes. Thus, the oxide film grows up in the areas corresponding to the openings of the nitride film 1. At this time, since the areas corresponding to the openings of the nitride film 1 are the "first lightly-N-well area", the "second lightly-N-area" and the "N-well area", these areas are oxidized simultaneously, which results in simultaneous formation of the oxide film 4, the oxide film 4b and the oxide film 9 on the respective well areas. Additionally, the phosphorous ions 8 that have been implanted are driven into the substrate 10, which forms the N-well 20. With this heat treatment, the phosphorous ions are further driven into the substrate 10 in the lightly-N-well area 5a and the lightly-N-well 5b, and, thereby, the lightly-N-well area 5a and the lightly-N-well 5b become deeper.

As shown in FIG. 6-(G), after removing the nitride film 1, boron ions 11 are implanted into the substrate 10 using an ion implantation or doping technique in a self-aligning manner. At this time, an ion-implantation condition is selected so that the previously formed oxide films 4a, 4b and 9 serve as implantation masks. As for such a condition, it is suitable to select an acceleration energy of 30 KeV and an amount of impregnation of $1 \times 10^{13}$ cm$^{-2}$. Consequently, areas other than the oxide films 4a, 4b and 9 are defined as P-wells.

Then, as shown in FIG. 6-(H), the substrate 10 is heat-treated within a non-oxidizing atmosphere, for example, a nitrogen atmosphere, at 1150° C. for 60 minutes. Thereby, boron ions 11 are diffused and the P-wells 12 are formed. With this heat treatment, the phosphorous ions in the lightly-N-well 5a, the lightly-N-well 5b and the N-well 20 are further driven into the substrate 10, and, thereby, the junction depth of those wells become deeper.

It should be noted that, instead of the final heat treatment at 1150° C., a field oxidation may be applied to perform commonly the diffusion of the boron ions 11 and the separation of the elements. Removing the oxide films 4a, 4b and 9 on the surface of the substrate 10 completes the four kinds of wells, the lightly-N-well 5a, the lightly-N-well 5b, the N-well 20 and the P-wells 12.

Thereafter, the semiconductor device shown in FIG. 5 is completed by forming the field oxide film 30 for element isolation in accordance with a usual process, forming the gate electrodes 32, 38, 44a and 44b via the gate oxide films 31, 37, 43a and 43b, forming the diffusion layers 34, 36, 40, 42, 46a, 48a, 46b and 48b for providing sources and drains, forming the inter-layer insulating film 50, and forming the metal wires 52 via contact holes.

It is an advantage of the above-mentioned method that the film thickness of the oxide films 4a, 4b and 9 are equal to each other since the oxide film 4a in the area of the lightly-N-well 5a, the oxide film 4b in the area of the lightly-N-well 5b and the oxide film 9 in the area of the N-well 20 are formed simultaneously in the same process. As a result, the surface level (height) of the lightly-N-well 5a, the surface level (height) of the lightly-N-well 5b and the surface level (height) of the N-well 20 become equal to each other in the state shown in FIG. 6-(H), which is a configuration after the removal of the oxide films 4a, 4b and 9. Since the surface levels (height) of the wells 5a, 5b and 20 are equal to each other, the "step between the lightly-N-well 5a and the P-we 12", the "step between the lightly-N-well 5a and the P-we 12" and the "step between the N-well 20 and the P-well 12" can be the same configuration, which is convenient for progressing the manufacturing process. Furthermore, since the original film thickness of the oxide films 4a, 4b and 9 are about 300 nm, there is no problem in the absolute values of the level differences.

Although a total of four kinds of wells are formed in the embodiment shown in FIG. 6 by repeating twice the series of the photolithography processes shown in FIGS. 6-(A) and 6-(B), the etching process, the ion implantation process, the resist removing process and the heat treatment process within a non-oxidizing atmosphere, (n+2) kinds of wells can be formed without increasing the level difference between wells by repeating the series of processes n times (n is an arbitrary number).

Moreover, the heat treatments in the processes of FIG. 6-(B) and FIG. 6-(D) can be omitted if a subsequent heat treatment is commonly applied as the heat treatments. Thus, the wells of desired depths can be formed by selecting whether to insert the heat treatment process in the middle and adjusting the time of the heat treatment process. If a plurality of heat treatment processes are needed, wells to be provided with a larger depth may be formed earlier.

Third Embodiment

Figure 7:
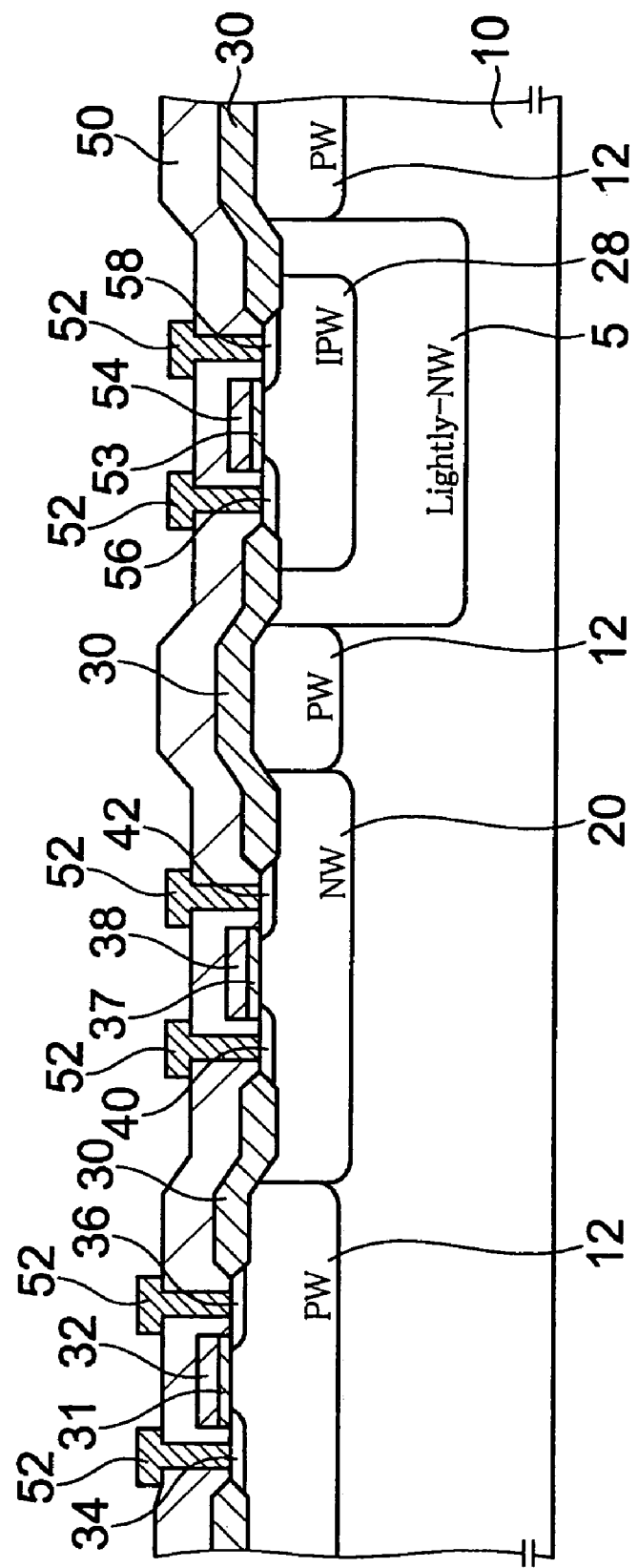
FIG. 7 is a cross-sectional view of a part of a semiconductor device according to a third embodiment of the present invention.

A description will now be given, with reference to FIG. 7, of a third embodiment of the present invention. FIG. 7 is a cross-sectional view of a part of a semiconductor device according to the third embodiment of the present invention.

The semiconductor device according to the third embodiment differs from the semiconductor device shown in FIG. 2 in that the semiconductor device according to the third embodiment has a triple well structure in which an IP-well (IPW) having an opposite conductivity-type, which is shallower than the lightly-N-well 5, is formed in the lightly-N-well 5. The IP well is separated from the P-type silicon substrate by the lightly-N well 5 so that a potential can be applied independently from the substrate 10, which provides insensitivity to a noise from the substrate. Therefore, the IP well 28 is suitable for forming a MOS transistor, which is insensitive to a noise from the substrate, such as a MOS transistor used for an application that needs measures for a noise or a transistor for a negative power supply voltage A source 56 and a drain 58 are formed by N-type diffusion layers in an element area of the IP well 28, and a gate electrode 54 of a polysilicon is formed on an area between the diffusion layers 56 and 58 via a gate oxide film 53, which together constitute an N-channel MOS transistor. Additionally, an inter-layer film 50 is formed so as to cover the MOS transistor, and metal wires 52 are connected to each diffusion layer via contact holes.

Figure 8:
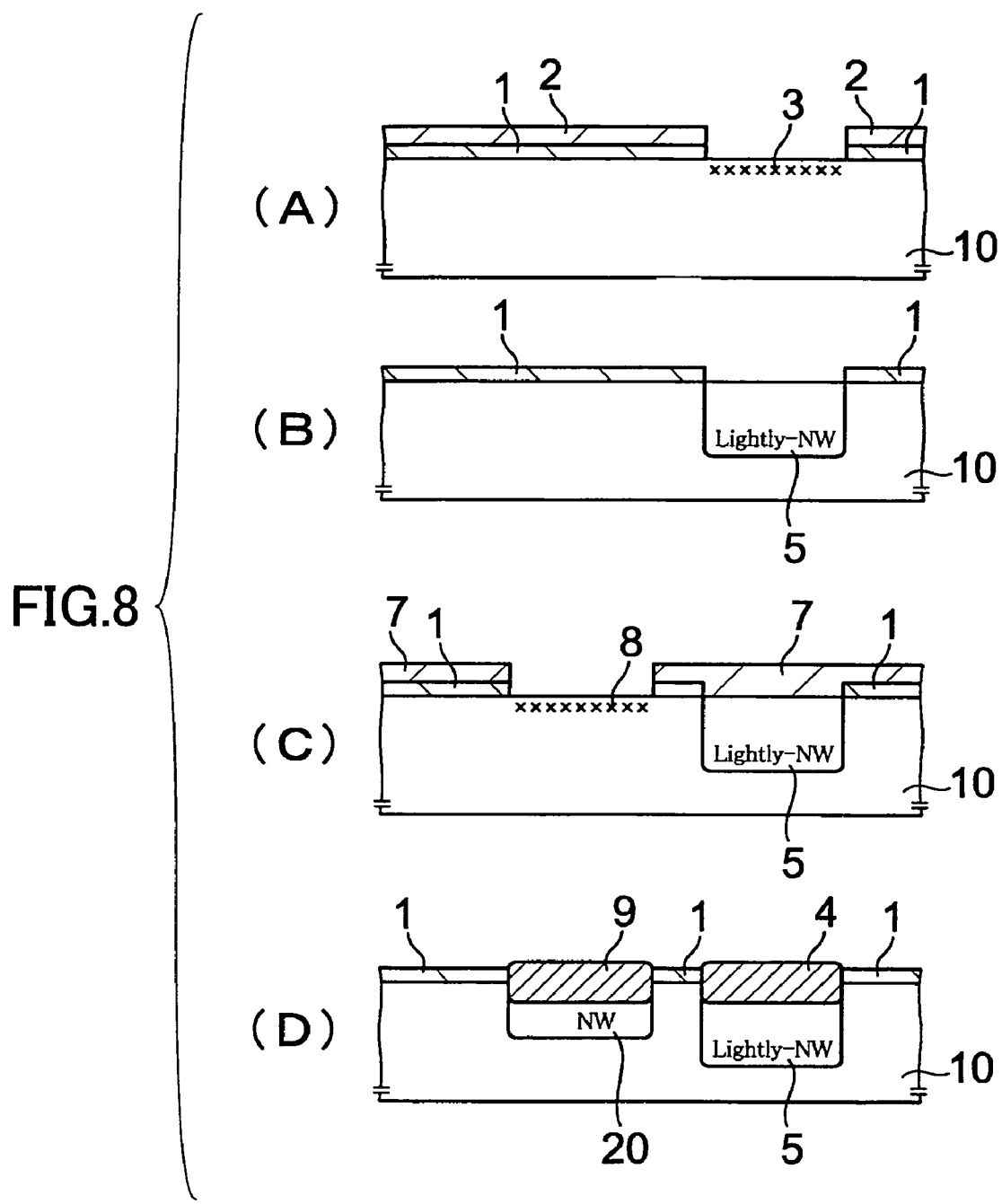
FIG. 8 is an illustration for explaining a part of a manufacturing process of the semiconductor device shown in FIG. 7.
Figure 9:
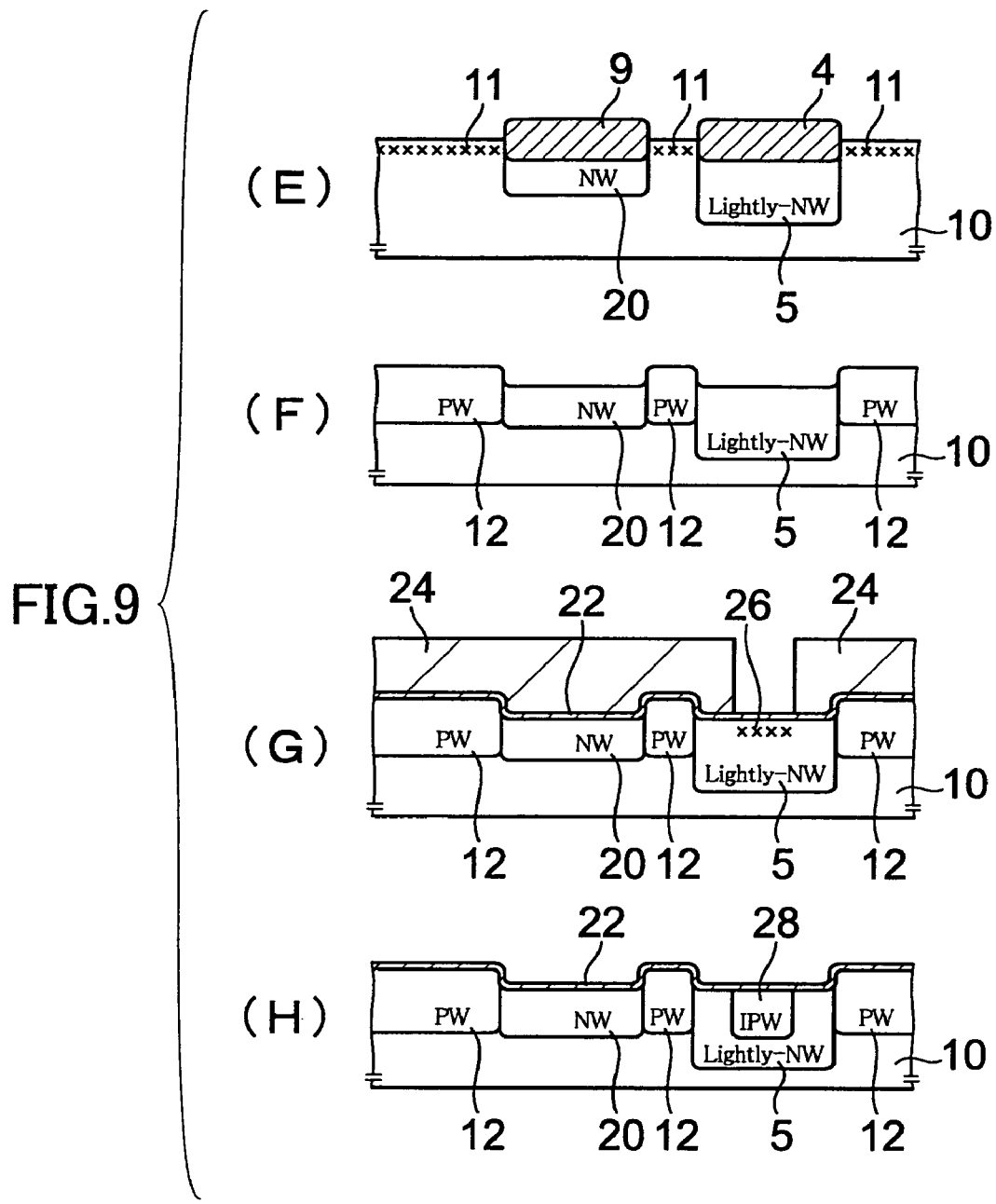
FIG. 9 is an illustration for explaining a part of the manufacturing process of the semiconductor device shown in FIG. 7.

A description will now be given, with reference to FIG. 8 and FIG. 9, of a method of forming wells to manufacture the semiconductor device shown in FIG. 7. FIGS. 8 and 9 are illustrations for explaining a manufacturing process of the semiconductor device shown in FIG. 7.

As shown in FIG. 8-(A), a nitride film 1 is deposited on the silicon substrate 10 with a film thickness of about 100 nm, and a resist pattern 2 is formed on the nitride film 1 using a photolithography process so as to define a lightly-N-well area. After removing by etching a portion of the nitride film 1 corresponding to an opening of the resist, phosphorous ions 3 are implanted into the substrate 10 using an ion implantation or doping technique with an acceleration energy of 160 KeV and an amount of implantation of $5\times10^{12}$ cm$^{-2}$.

Then, as shown in FIG. 8-(B), after removing the resist pattern 2, the substrate 10 is heat-treated within a non-oxidizing atmosphere such as a nitrogen atmosphere at 1150° C. for 5 hours. Thereby, the phosphorous ions 3 are driven into the substrate 10, which forms the lightly-N-well 5.

Then, as shown in FIG. 8-(C), a resist pattern 7 is formed using a photolithography process so as to define an N-well area. After removing by etching a portion of the nitride film 1 corresponding to an opening of the resist, phosphorous ions 8 are implanted into the substrate 10 using an ion implantation or doping technique with an acceleration energy of 160 KeV and an amount of implantation of $1\times10^{13}$ cm$^{-2}$.

Then, as shown in FIG. 8-(D), after removing the resist pattern 7, the substrate 10 is heat-treated within an oxidizing atmosphere at 920° C. for 120 minutes. Thus, the oxide films grow up in the areas corresponding to the openings of the nitride film 1. At this time, since the areas corresponding to the openings of the nitride film 1 are the "lightly-N-well area" and the "N-well area", the both areas are oxidized simultaneously, which results in simultaneous formation of the oxide film 4 and the oxide film 9 on the respective well areas. Additionally, the phosphorous ions 8 that have been implanted are driven into the substrate 10, which forms the N-well 20 and causes the junction depth of the lightly-N-well 5 deeper.

Now reference is made to FIG. 9, in which the reference sign of the process starts from not (A) but from (E) since the processes shown in FIG. 9 are subsequent to the process of FIG. 8-(D).

As shown in FIG. 9-(E), after removing the nitride film 1, boron ions 11 are implanted into the substrate 10 using an ion implantation or doping technique in a self-aligning manner. At this time, an ion-implantation condition is selected so that the previously formed oxide films 4 and 9 serve as implantation masks. As for such a condition, it is suitable to select an acceleration energy of 30 KeV and an amount of impregnation of $1\times10^{13}$ cm$^{-2}$. Consequently, areas other than the oxide films 4 and 9 are defined as P-wells.

Consequently, areas other than the oxide films 4 and 9 are defined as P-wells.

Then, as shown in FIG. 9-(F), the substrate 10 is heat-treated within a non-oxidizing atmosphere, for example, a nitrogen atmosphere, at 1150° C. for 60 minutes. Thereby, the boron ions 11 are diffused and the P-wells 12 are formed, and the junction depths of the previously formed lightly-N-well 5 and the N-well 20 become larger. Removal of the oxide films 4 and 9 on the surface of the substrate 10 completes the three kinds of wells, the lightly-N-well 5, the N-well 20 and the P-wells 12.

Then, as shown in FIG. 9-(G), an oxide film having a thickness about 20 nm is formed on the substrate 10 by heat-treating the substrate 10 within an oxidizing atmosphere at 920° C. for 10 minutes. A resist pattern 24 is formed on the oxide film 22 by a photolithography process so as to define an IP-well area (a relatively shallow well of an opposite conductivity type within a deep lightly-N-well). Boron ions 26 are implanted into the substrate 10 through the opening of the resist using an ion implantation or doping technique with an acceleration energy of 180 KeV and amount of impregnation of $1.6\times10^{13}$ cm$^{-2}$.

Then, as shown in FIG. 9-(H), after removing the resist pattern 24, the substrate 10 is heat-treated within a non-oxidizing atmosphere, for example, a nitrogen atmosphere, at 1000° C. for 160 minutes. Thereby, the boron ions 26 are diffused in the lightly-N-well 5, and, finally a total of four wells, the Lightly-N-well 5, the N-well 20, the P-well 12 and the IP-well 28 are formed.

It should be noted that, instead of the final heat treatment at 1000° C., a field oxidation may be applied to perform commonly the diffusion of the boron ions 26 and the separation of the elements.

Thereafter, the semiconductor device shown in FIG. 7 is completed by removing the oxide film 22, forming the field oxide film 30 for element isolation in accordance with a usual process, forming the gate electrodes 32, 38 and 54 via the gate oxide films 31, 37 and 53, forming the diffusion layers 34, 36, 40, 42, 56 and 58 for providing sources and drains, forming the inter-layer insulating film 50, and forming the metal wires 52 via contact holes.

According to the above-mentioned method, the film thickness of the oxide films 4 and 9 are equal to each other since the oxide film 4 in the area of the lightly-N-well 5 and the oxide film 9 in the area of the N-well 20 are formed simultaneously in the same process. As a result, the surface level (height) of the lightly-N-well 5 and the surface level (height) of the N-well 20 become equal to each other in the state shown in FIG. 9-(F), which is a configuration after the removal of the oxide films 4 and 9.

In the above-mentioned process of (B) explained with reference to FIG. 6-(B), the above-mentioned process (D) explained with reference to FIG. 6-(D) and the above-mentioned process (B) explained with reference to FIG. 8-(B), in order to shorten the process time, the heat treatment (hereinafter, referred to as a drive process) in the nitrogen atmosphere for diffusing impurities deeply may be performed at a temperature exceeding 1150° C., for example, a temperature in a rage from 1160° C. to 1180° C.

Figure 10:
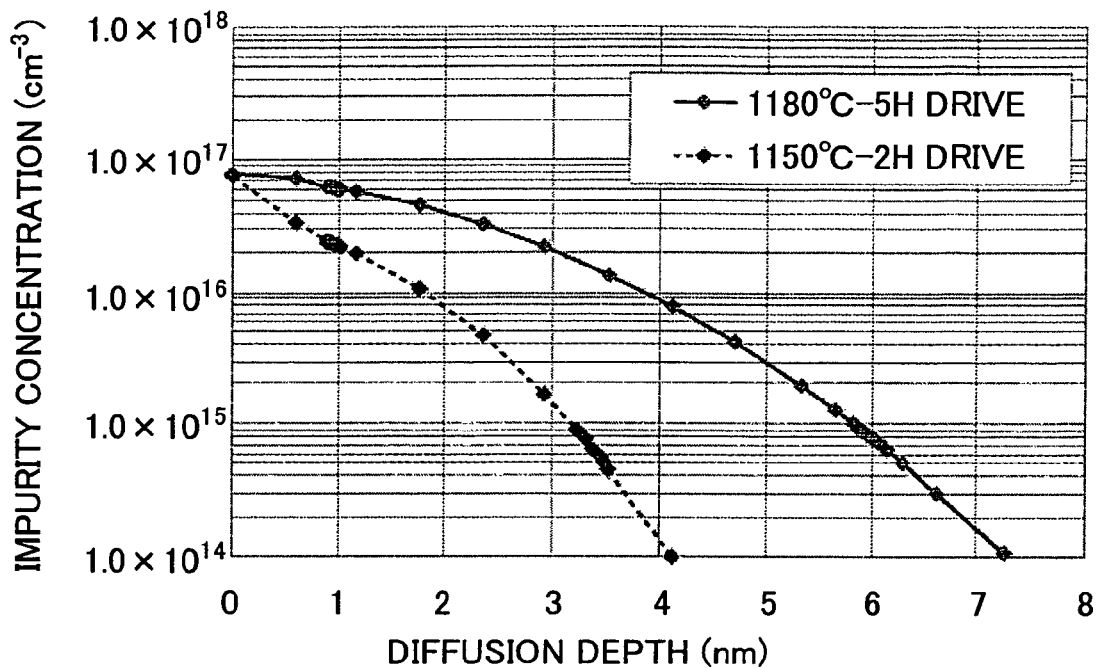
FIG. 10 is a graph showing a result of simulation of an impurity concentration profile in a case of forming a deep N-type well under two kinds of conditions.

FIG. 10 is a graph showing a result of simulation of an impurity concentration profile in a case of forming a deep N-type well under two kinds of drive process conditions, one being at 1150° C. for 2 hours (1150° C.-2H-drive) and the other being at 1180° C. for 5 hours (1180° C.-5H-drive). In the graph, a solid curve indicates the 1180° C.-5H-drive, and a dotted curve indicates the 1150° C.-2H-drive. In FIG. 10, the vertical axis represents an impurity concentration (cm$^{-3}$) and the horizontal axis represents a diffusion depth (μm).

It can be interpreted from FIG. 10 that the process of the 1180° C.-5H-drive can form a deeper well than the process of the 1150° C.-2H-drive. Moreover, the junction depth obtained by the 1150° C.-2H-drive process is 3.2 μm, and the junction depth obtained by the 1180° C.-5H-drive process is 5.8 μm.

Figure 11:
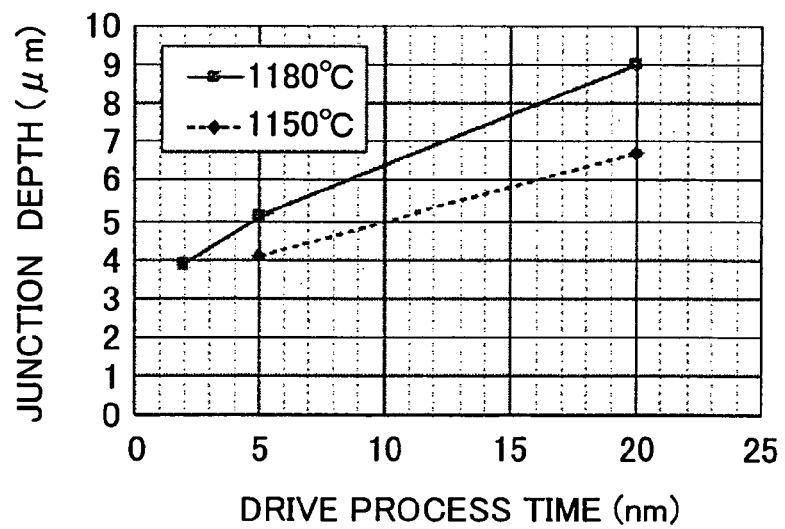
FIG. 11 is a graph showing a relationship between a drive process time and a junction depth when forming a deep N-type well.

FIG. 11 is a graph showing a relationship between a drive process time and a junction depth when forming a deep N-type well. A solid line indicates a drive process temperature of 1180° C. and a dotted line indicates a drive process temperature of 1150° C. In FIG. 11, the vertical axis represents a junction depth (μm) of a well and the horizontal axis represents a drive process time (hour).

It can be interpreted from FIG. 11 that, when forming a well having a junction depth of 5 μm, it takes 10 hours with the condition of the drive process temperature of 1150° C. while it takes about 5 hours, which is one half, with the condition of the drive process temperature of 1180° C. Therefore, if it is converted into a throughput, it can be said that a throughput of the drive process at 1180° C. is twice the throughput of the drive process at 1150° C. Thus, it is preferable to perform the heat treatment, when forming a well, at a higher temperature.

Figure 12:
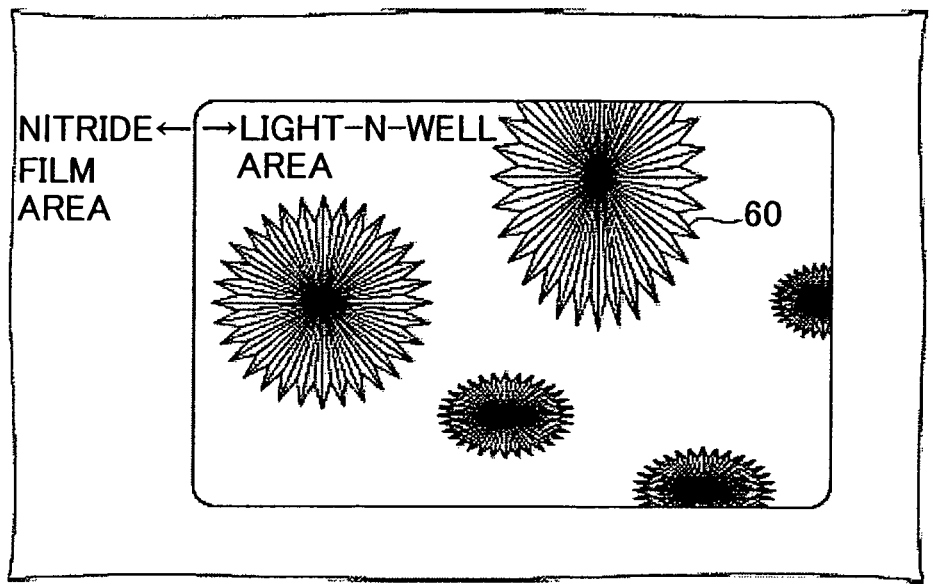
FIG. 12 is an illustration of a microphotography indicating a radial crystal defect.

However, when performing a heat treatment at a temperature exceeding 1150° C., if there are damage areas on the surface of the silicon substrate 10 due to an ion implantation or etching, a radial crystal defect 60 shown in FIG. 12 may be generated. FIG. 12 is an illustration of a microphotography indicating the radial crystal defect that was generated when a heat treatment was performed at 1180° C. within a nitrogen atmosphere. Thus, if the temperature of heat treatment within a non-oxidizing atmosphere is raised up to 1180° C., a sever damage may occur in the crystal arrangement of the silicon substrate.

Figure 13:
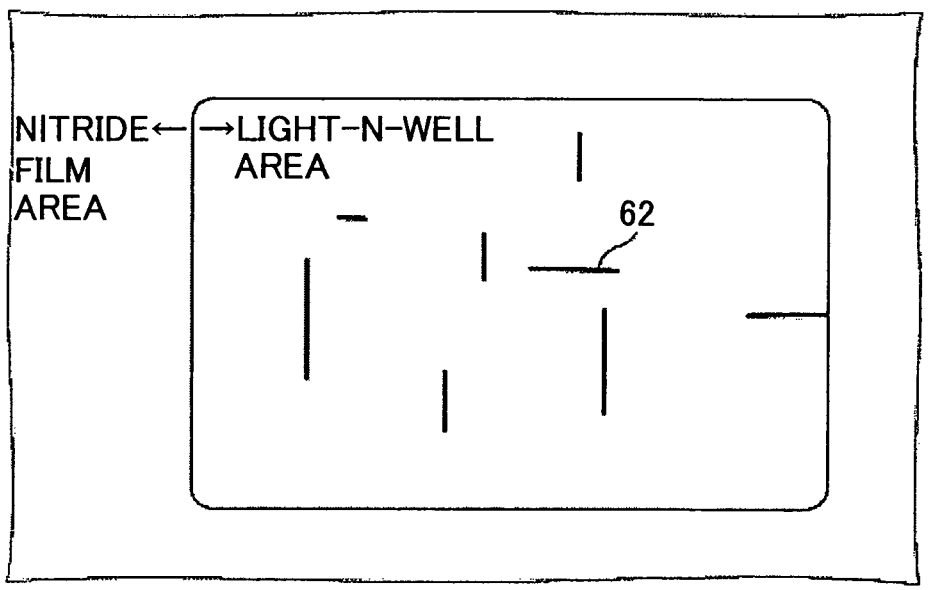
FIG. 13 is an illustration of a microphotography indicating an OSF generated in a silicon substrate area.

Moreover, even if the radial crystal defect does not occur within a nitrogen atmosphere when performing a heat treatment at a temperature exceeding 1150° C. within the nitrogen atmosphere, a linear crystal defect shown in FIG. 13 (referred to as OSF (oxidation-induced stacking fault)) may be generated when performing a heat treatment in a subsequent process within a oxidizing atmosphere. FIG. 13 is an illustration of a microphotography indicating the OSF generated in a silicon substrate area, which was subjected to a heat treatment at 1180° C. within a nitrogen atmosphere, after forming a thick oxide film of 200 nm in a subsequent process.

The following Table 1 shows a result of investigation on a relationship between drive process temperature and a generation crystal defect. In Table 1, the mark ○ indicates that there was no fault generated, and the mark X shows that a fault was generated. It should be noted that, in Table 1, the mark X is provided when there is seen a crystal defect, and a number of faults generated was larger as the drive process temperature is higher.

TABLE 1

| kinds of crystal | drive process temperature | | | |
|---|---|---|---|---|
| defect | 1150° C. | 1160° C. | 1170° C. | 1180° C. |
| radial crystal defect | ○ | X | X | X |
| OSF | X | X | X | X |

If at least one of the radial crystal defect and the OSF occurs in a device, the device cannot operates normally, which invites a problem that an yield rate of semiconductor products is decreased.

Accordingly, when performing a heat treatment at a temperature exceeding 1150° C. within a nitrogen atmosphere, it is preferable to form a protective oxide film having a thickness of 10 to 50 nm on the surface of each of the lightly-N-wells 5, 5a and 5b by a heat treatment at 800° C. to 1000° C. within an oxidizing atmosphere before performing the heat treatment within the nitrogen atmosphere.

The following Table 2 shows a result of investigation regarding a relationship between a drive process temperature and a generation of a crystal defect when varying a thickness of the protective oxide film, which was formed prior to the drive process. In the Table 2, the mark ○ indicates that no fault was generated, the mark X indicates that both the radial crystal defect and the OSF were generated, and the mark Δ indicates that only the OSF was generated.

TABLE 2

| thickness of protective oxide | drive process temperature | | | |
|---|---|---|---|---|
| film | 1150° C. | 1160° C. | 1170° C. | 1180° C. |
| 0 nm | Δ | X | X | X |
| 10 nm | ○ | — | — | ○ |
| 20 nm | ○ | — | — | ○ |
| 30 nm | ○ | — | — | ○ |
| 40 nm | ○ | — | — | ○ |

When the protective oxide film was not formed (oxide film thickness is 0 nm in Table 2), it was found that the OSF is generated at a temperature equal to or higher than 1150° C., and the radial crystal defect and the OFS are generated at a temperature equal to or higher than 1160 doc. On the other hand, by forming the protective oxide film having a film thickness of 10-40 nm prior to the drive process, it was found that no crystal defect is generated even if the drive process temperature was raised to 1180° C. This means that a good-quality well having a sufficient depth and having no crystal defect can be formed by forming the protective oxide film prior to the drive process. It should be noted that although data regarding the oxide film thickness of 10-40 nm at the drive process temperatures of 1160° C. and 1170° C. in Table 2, it can be supposed that there is no crystal defect generated in the condition corresponding to the data not shown in Table 2 since there was no crystal defect generated when the protective oxide film thickness is 10-40 nm at 1150° C.

Moreover, it can be supposed from the data of Table 2 that generation of crystal defect can be prevented even when the protective oxide film thickness is larger than 40 nm. However, if the oxidization film thickness becomes larger than 50 nm, the oxide film thickness is too much larger since another thick oxide film is formed thereon in a subsequent process. Thus, when the oxide film is finally removed, a large step (level difference) is formed on the surface of the substrate. Thus, it is preferable that the thickness of the protective oxide film is set to be equal to or smaller than 50 nm, that is, 10 nm to 50 nm.

As mentioned above, although it was explained that it is preferable to form the protective oxide film prior to the drive process when raising the drive process temperature higher than, for example, 1150° C. so as to form a well having a large junction depth, the present invention is not limited to such a process and the protective oxide film may not be formed when forming a well having a large junction depth at a drive process temperature of equal to or lower than 1150° C. In this case, although the drive process time is increased, generation of crystal defect can be prevented.

In the above-mentioned embodiments, the conductivity type of the wells explained in the above-mentioned embodiments is an example, and is not limited to the specifically explained type. For example, if the ion source used for the ion implantation is changed from phosphorous to boron and from born to phosphorous, the conductivity type can be reversed. Moreover, although the silicon nitride film is directly formed on the surface of the silicon substrate in the above-mentioned embodiments, the present invention is not limited to such a structure. For example, an oxide film having a thickness of, for example, 20 nm may be formed as a buffer on the surface of the silicon substrate prior to the formation of the nitride film in a case where a stress caused by the nitride film or a pollution due to a resist for patterning the nitride film may cause a problem.

The present invention is not limited to the specifically disclosed embodiments, and variations and modifications may be made without departing from the scope of the present invention.

The present application is based on Japanese priority applications No. 2003-079121 filed Mar. 20, 2003, No. 2003-196847 filed Jul. 15, 2003 and No. 2003-379401 filed Nov. 10, 2003, the entire contents of which are hereby incorporated by reference.

What is claimed is:

1. A manufacturing method of a semiconductor device having more than three kinds of wells in a single substrate, comprising the steps of:
    (A) forming a silicon nitride film on said substrate;
    (B) forming a first resist pattern by a photolithography to define a first well area, removing a part of said silicon nitride film corresponding to an opening of said first resist pattern by etching, introducing first impurity ions into said first well area of said substrate by ion implantation so as to form said first well area, and removing said first resist pattern;
    (C) forming a second resist pattern by a photolithography so as to form a second well area, removing a part of said silicon nitride film corresponding to an opening of said second resist pattern by etching so as to define said second well area, introducing second impurity ions into said second well area of said substrate by ion implantation so as to form the second well, and removing said second resist pattern;
    (D) applying a heat treatment to said substrate within an oxidizing atmosphere so as to form a thermal oxide film on an area of a surface of said substrate that is not covered by said silicon nitride film and simultaneously diffuse the first and second impurity ions introduced into said substrate to form the first and second wells;
    (E) removing said silicon nitride film, and introducing third impurity ions into said substrate by using said thermal oxide film as a mask so as to form a third well area in a self-alignment manner; and
    (F) applying a heat treatment to said substrate in a non-oxidizing atmosphere so as to diffuse the third impurity ions to form the third well.

2. The manufacturing method as claimed in claim 1, wherein the step (B) includes a step of applying a heat treatment in a non-oxidizing atmosphere before proceeding to a subsequent ion implantation process.

3. The manufacturing method as claimed in claim 2, wherein the step (B) includes a step of applying a heat treatment to said substrate in an oxidizing atmosphere so as to form a protective oxide film on the surface of said substrate before applying the heat treatment in said non-oxidizing atmosphere.

4. The manufacturing method as claimed in claim 3, wherein said protective oxide film has a thickness in a range of 10 nm to 50 nm.

5. The manufacturing method as claimed in claim 1, wherein the process of step (B) is repeated for a plurality of times while changing at least one of a kind of said first impurity ions, an amount of said first impurity ions to be introduced and an implantation condition of said first impurity ions.

6. The manufacturing method as claimed in claim 1, further comprising a step of applying a heat treatment to said substrate in a non-oxidizing atmosphere after repeating the process of step (B) and before proceeding to a subsequent ion implantation process.

7. The manufacturing method as claimed in claim 6, further comprising a step of applying a heat treatment to said substrate in an oxidizing atmosphere so as to form a protective oxide film on the surface of said substrate before applying the heat treatment in said non-oxidizing atmosphere.

8. The manufacturing method as claimed in claim 7, wherein said protective oxide film has a thickness in a range of 10 nm to 50 nm.

* * * * *